United States Patent
Kang et al.

(10) Patent No.: US 11,815,556 B2
(45) Date of Patent: Nov. 14, 2023

(54) APPARATUS AND METHOD FOR DIAGNOSING FAILURE OF SWITCH UNIT INCLUDED IN MULTI BATTERY PACK

(71) Applicant: LG Energy Solution, Ltd., Seoul (KR)

(72) Inventors: Su-Won Kang, Daejeon (KR); Han-Sol Kim, Daejeon (KR); Bum-Hee Lee, Daejeon (KR); Sang-Ki Lee, Daejeon (KR)

(73) Assignee: LG Energy Solution, Ltd.

( * ) Notice: Subject to any disclaimer, the term of this patent is extended or adjusted under 35 U.S.C. 154(b) by 86 days.

(21) Appl. No.: 17/600,173

(22) PCT Filed: Nov. 13, 2020

(86) PCT No.: PCT/KR2020/016035
§ 371 (c)(1),
(2) Date: Sep. 30, 2021

(87) PCT Pub. No.: WO2021/096312
PCT Pub. Date: May 20, 2021

(65) Prior Publication Data
US 2022/0155371 A1    May 19, 2022

(30) Foreign Application Priority Data

Nov. 13, 2019  (KR) .......................... 10-2019-0145238
Nov. 12, 2020  (KR) .......................... 10-2020-0151350

(51) Int. Cl.
*G01R 31/327*   (2006.01)
*G01R 31/389*   (2019.01)
(Continued)

(52) U.S. Cl.
CPC ......... *G01R 31/327* (2013.01); *G01R 31/389* (2019.01); *G01R 31/3842* (2019.01);
(Continued)

(58) Field of Classification Search
CPC .................................................. G01R 31/327
(Continued)

(56) References Cited

U.S. PATENT DOCUMENTS

2011/0109275 A1   5/2011   Taniguchi
2012/0235687 A1   9/2012   Abe et al.
(Continued)

FOREIGN PATENT DOCUMENTS

CN   104578307 B   1/2017
JP     5733786 B2   6/2015
(Continued)

OTHER PUBLICATIONS

Extended European Search Report for Application No. 20888006.2 dated Jul. 12, 2022. 7 pgs.
(Continued)

*Primary Examiner* — Vincent Q Nguyen
(74) *Attorney, Agent, or Firm* — Lerner David LLP (57) ABSTRACT

An apparatus and method for diagnosing a failure of a switch unit included in a multi battery pack. The magnitude of a pack current flowing from each of battery packs connected in parallel to a load is measured, a battery pack whose pack current has a magnitude smaller than the average value by a threshold value or more is identified, and it is determined that an open failure occurs at the switch unit included in the identified battery pack, and the information of the battery pack including the switch unit at which the open failure occurs is output. The internal resistance of each battery pack may be statistically analyzed in order to more accurately diagnose the failure at the switch unit. Thus, an open failure of switch units included in battery packs connected in parallel may be easily and reliably diagnosed in a statistical viewpoint.

12 Claims, 8 Drawing Sheets

(51) Int. Cl.
*G01R 31/3842* (2019.01)
*H01M 10/42* (2006.01)
*H01M 10/48* (2006.01)
*H02J 7/00* (2006.01)

(52) U.S. Cl.
CPC ....... *H01M 10/425* (2013.01); *H01M 10/482* (2013.01); *H02J 7/0024* (2013.01); *H02J 7/0029* (2013.01); *H01M 2010/4271* (2013.01)

(58) Field of Classification Search
USPC .............. 324/415, 424, 426, 432–435, 76.11
See application file for complete search history.

(56) References Cited

U.S. PATENT DOCUMENTS

| | | | |
|---|---|---|---|
| 2013/0113495 | A1 | 5/2013 | Kim et al. |
| 2013/0116875 | A1 | 5/2013 | Oh et al. |
| 2013/0320986 | A1 | 12/2013 | Shiraishi et al. |
| 2014/0002003 | A1 | 1/2014 | Kim |
| 2015/0185271 | A1 | 7/2015 | Kim et al. |
| 2015/0323603 | A1 | 11/2015 | Kim et al. |
| 2019/0128965 | A1 | 5/2019 | Park et al. |
| 2019/0379217 | A1 | 12/2019 | Song et al. |
| 2020/0280197 | A1* | 9/2020 | Winger ................... B60L 50/64 |

FOREIGN PATENT DOCUMENTS

| | | |
|---|---|---|
| JP | 2016082667 A | 5/2016 |
| JP | 6414460 B2 | 10/2018 |
| JP | 2018200834 A | 12/2018 |
| KR | 20100054153 A | 5/2010 |
| KR | 20120005729 A | 1/2012 |
| KR | 20140003201 A | 1/2014 |
| KR | 20140020765 A | 2/2014 |
| KR | 101551035 B1 | 9/2015 |
| KR | 101551088 B1 | 9/2015 |
| KR | 101689501 B1 | 12/2016 |
| KR | 20180067102 A | 6/2018 |
| KR | 20190034888 A | 4/2019 |
| WO | 2012050163 A1 | 4/2012 |
| WO | 2013021956 A1 | 2/2013 |

OTHER PUBLICATIONS

International Search Report for Application No. PCT/KR2020/016035, dated Feb. 25, 2021, 3 pages.

* cited by examiner

PRIOR ART

|  | 1 | 2 | 3 | 4 | 5 |
|---|---|---|---|---|---|
| MEASURED VALUE OF PACK CURRENT | 15A | 12A | 14A | 17A | 0.1A |
| DIFFERENCE BETWEEN MEASURED VALUE OF PACK CURRENT AND AVERAGE VALUE | 0.5 | 0.03 | 0.34 | 0.82 | -1.71 |
| INTERNAL RESISTANCE OF BATTERY PACK | 115mΩ | 112mΩ | 105mΩ | 101mΩ | 119mΩ |
| DIFFERENCE BETWEEN INTERNAL RESISTANCE AND AVERAGE VALUE | 0.62 | 0.218 | -0.73 | -1.28 | 1.17 |

APPARATUS AND METHOD FOR DIAGNOSING FAILURE OF SWITCH UNIT INCLUDED IN MULTI BATTERY PACK

CROSS-REFERENCE TO RELATED APPLICATIONS

The present application is a national phase entry under 35 U.S.C. § 371 of International Application No. PCT/KR2020/016035 filed Nov. 13, 2020, published in Korean, which claims priority from Korean Patent Application No. 10-2019-0145238 filed Nov. 13, 2019, and Korean Patent Application No. 10-2020-0151350 filed Nov. 12, 2020, all of which are incorporated herein by reference.

TECHNICAL FIELD

The present disclosure relates to an apparatus and method for diagnosing a failure of a switch unit, and more particularly, to an apparatus and method for diagnosing an open failure of a switch unit included in each battery pack of a multi battery pack in which a plurality of battery packs are connected in parallel.

BACKGROUND ART

The application field of batteries is gradually increasing not only to mobile devices such as cellular phones, laptop computers, smart phones and smart pads, but also electric vehicles (EVs), hybrid electric vehicles (HEVs), plug-in hybrid electric vehicles (PHEVs), large-capacity energy storage systems (ESS), or the like.

A battery system mounted to an electric vehicle includes a plurality of battery packs connected in parallel to secure a high energy capacity, and each battery pack includes a plurality of battery cells connected in series. Hereinafter, the plurality of battery packs connected in parallel will be referred to as a multi battery pack.

In this specification, the battery cell may include one unit cell or a plurality of unit cells connected in parallel. The unit cell refers to one independent cell that has a negative electrode terminal and a positive electrode terminal and is physically separable. For example, one pouch-type lithium polymer cell may be regarded as a unit cell.

When the multi battery pack is charged or discharged, all battery packs may be discharged or charged, or only some battery packs may be charged or discharged. The case where only some battery pack(s) are charged or discharged may happen when a failure occurs in a specific battery pack, when only some battery packs are charged or discharged for pack balancing, or when it is not necessary to operate all battery packs since the required discharging or charging power is small.

In order to control such selective discharging or charging, each battery pack of the multi battery pack includes a switch unit therein. The switch unit functions to connect or disconnect the battery pack to/from a load or charger independently.

If an open failure occurs at the switch unit, the turn-off state is maintained even if a turn-on signal is applied to the switch unit. Therefore, it is impossible to independently discharge or charge a battery pack including a switch unit in which an open failure has occurred.

The open failure of the switch unit included in a single battery pack may be diagnosed by monitoring a voltage applied between a positive electrode and a negative electrode of the battery pack in a state where a turn-on signal is applied to the switch unit.

Figure 1:
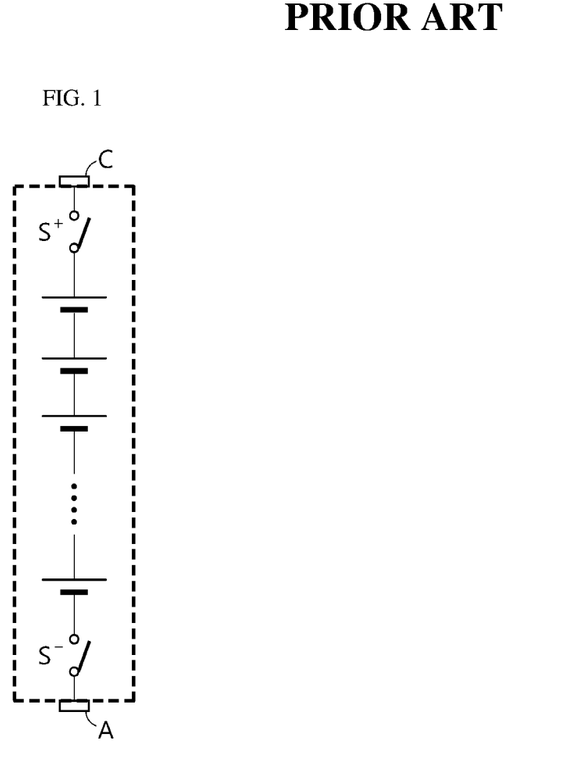
FIG. 1 is a diagram schematically showing a conventional method for diagnosing an open failure of a switch unit included in a single battery pack.

FIG. 1 is a diagram schematically showing a conventional method for diagnosing an open failure of a switch unit included in a single battery pack.

Referring to FIG. 1, the switch unit included in the battery pack includes a high-potential switch $S^+$ and a low-potential switch $S^-$. The high-potential switch $S^+$ is installed on a line connecting an external positive electrode terminal C to a positive electrode of a cell with the highest potential among the cells connected in series inside. In addition, the low-potential switch $S^-$ is installed on a line connecting the external negative electrode terminal A to a negative electrode of a cell with the lowest potential among the cells connected in series.

If an open failure occurs in either the high-potential switch or the low-potential switch of the switch unit, the switch unit maintains the turn-off state even if a turn-on signal is applied to the switch unit, so a voltage is not applied between the external positive electrode terminal C and the external negative electrode terminal A of the battery pack. Meanwhile, if there is no open failure at the switch unit, the switch unit operates normally when a turn-on signal is applied to the switch unit, so the output voltage of the battery pack is applied between the external positive electrode terminal C and the external negative electrode terminal A of the battery pack.

Therefore, if the voltage applied between the external positive electrode terminal C and external negative electrode terminal A of the battery pack is monitored in a state where a turn-on signal is applied to the switch unit, it is possible to diagnose whether an open failure occurs at the switch unit. That is, when the turn-on signal is applied to the switch unit, if the output voltage of the battery pack is not measured between the external positive electrode terminal C and the external negative electrode terminal A of the battery pack, it may be diagnosed that an open failure occurs at the switch unit.

Meanwhile, it is difficult to apply the conventional diagnosing method as described above to a multi battery pack in which two or more battery packs are connected in parallel.

Figure 2:
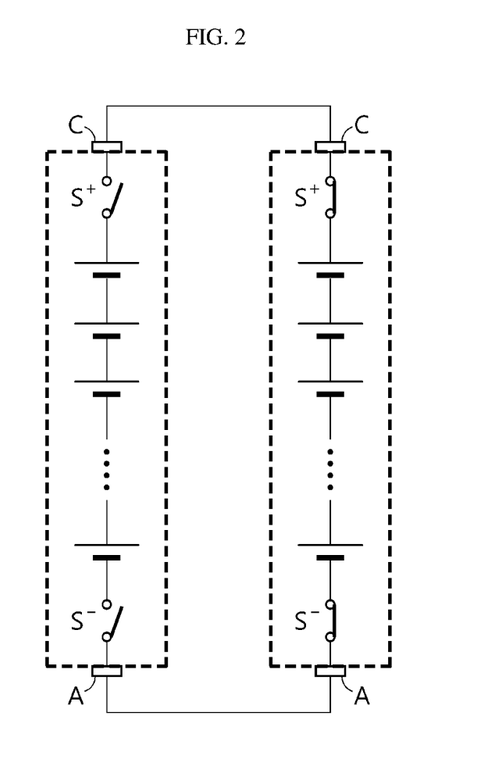
FIG. 2 is a diagram for illustrating why it is difficult to diagnose a failure of a switch unit for a multi battery pack in which two battery packs are connected in parallel.

FIG. 2 is a diagram for illustrating why it is difficult to diagnose a failure of a switch unit for a multi battery pack in which two battery packs are connected in parallel.

Referring to FIG. 2, a turn-on signal is applied to a multi battery pack in which two battery packs are connected in parallel in order to diagnose an open failure of a switch unit. In the switch unit included in a left battery pack, an open failure occurs so that the high-potential switch and low-potential switch are maintained in a turn-off state. Meanwhile, the switch unit included in a right battery pack is turned on normally. Since the left battery pack and the right battery pack are connected in parallel, the output voltage of the right battery pack is applied between the external positive electrode terminal C and the external negative electrode terminal A of the left battery. Since a voltage is applied between the external positive electrode terminal C and the external negative electrode terminal A of the left battery pack even though an open failure occurs at the switch unit thereof as above, an open failure of the switch unit included in the left battery pack cannot be diagnosed using the conventional diagnosing method.

SUMMARY

Technical Problem

The present disclosure is designed to solve the problems of the related art, and therefore the present disclosure is directed to providing an apparatus and method capable of statistically diagnosing an open failure of each switch unit in a multi battery pack in which a plurality of battery packs respectively equipped with a switch unit are connected in parallel.

The present disclosure is also directed to providing an apparatus and method capable of diagnosing degradation of a battery pack while diagnosing a failure of a switch unit included in the battery pack.

Technical Solution

In one aspect of the present disclosure, there is provided an apparatus for diagnosing a failure of a switch unit included in a multi battery pack in which first to $n^{th}$ battery packs are connected in parallel through a parallel link node, the apparatus comprising: first to $n^{th}$ switch units respectively included in the first to $n^{th}$ battery packs; first to $n^{th}$ current sensors respectively installed on power lines connected to the first to $n^{th}$ battery packs to measure a current flowing through each battery pack; first to $n^{th}$ voltage sensors respectively installed at the first to $n^{th}$ battery packs to measure a voltage for each battery pack; and a control unit operably coupled with the first to $n^{th}$ switch units, the first to $n^{th}$ current sensors and the first to $n^{th}$ voltage sensors.

Preferably, the control unit may be configured to: measure a pack current flowing through each battery pack using the first to $n^{th}$ current sensors at a time point a preset amount of time after the first to $n^{th}$ switch units turn on; calculate an average pack current of the first to $n^{th}$ battery packs; determine occurrence of an open failure at the switch unit included in an identified battery pack identify based on a pack current of the identified battery pack having a magnitude smaller than an average pack current by a first threshold value or more; and output information about the identified battery pack including the switch unit at which the open failure occurs.

In an embodiment, the control unit may be configured to: periodically measure voltage and current of each battery pack using the first to $n^{th}$ voltage sensors and the first to $n^{th}$ current sensors while the multi battery pack is being charged or discharged; determine internal resistances of the first to $n^{th}$ battery packs from the periodically measured voltage data and current data for each battery pack; calculate an average internal resistance of the first to $n^{th}$ battery packs; and determine occurrence of the open failure at the switch unit included in the identified battery pack based further on an internal resistance of the identified battery pack being different from the average internal resistance by less than a second threshold value.

Preferably, the control unit may be configured to determine occurrence of the open failure at the switch unit included in the identified battery pack based further on the pack current of the identified battery pack having a magnitude smaller than the average pack current by at least 1.0 $\sigma_{current}$, wherein $\sigma_{current}$ is a standard deviation of the pack currents of the first to $n^{th}$ battery packs.

More preferably, the control unit may be configured to determine occurrence of the open failure at the switch unit included in the identified battery pack based further on the internal resistance of the identified battery pack being different from the average internal resistance by less than 2.0 $\sigma_R$, wherein $\sigma_R$ is a standard deviation of the internal resistances of the first to $n^{th}$ battery packs, and the pack current of the identified battery pack having a magnitude smaller than the average pack current by at least 1.0 $\sigma_{current}$, wherein $\sigma_{current}$ is a standard deviation of the pack currents of the first to $n^{th}$ battery packs.

In another embodiment, the control unit may be configured to output the information about the identified battery pack through a display unit, a notification unit or a communication unit.

In another aspect of the present disclosure, there is also provided a battery management system or an electric driving mechanism, comprising the apparatus of any of the embodiments described herein.

In another aspect of the present disclosure, there is also provided a method for diagnosing a failure of a switch unit included in a multi battery pack in which first to $n^{th}$ battery packs are connected in parallel through a parallel link node, first to $n^{th}$ switch units are respectively included in the first to $n^{th}$ battery packs, first to $n^{th}$ current sensors are respectively installed on power lines connected to the first to $n^{th}$ battery packs to measure a current flowing through each battery pack, and first to $n^{th}$ voltage sensors are respectively installed at the first to $n^{th}$ battery packs to measure a voltage for each battery pack, the method comprising: (measuring, by a control unit, a pack current flowing through each battery pack using the first to $n^{th}$ current sensors at a time point a preset amount of time after the first to $n^{th}$ switch units turn on, calculating, by the control unit, an average value of the pack currents; and determining, by the control unit, that occurrence of open failure at the switch unit included in an identified battery pack based on a pack current of the identified battery pack having a magnitude smaller than the average value by a first threshold value or more; and outputting, by the control unit, information about the identified battery pack including the switch unit at which the open failure occurs.

Preferably, the diagnosing method of the present disclosure may further comprise periodically measuring, by the control unit, voltage and current of each battery pack using the first to $n^{th}$ voltage sensors and the first to $n^{th}$ current sensors while the multi battery pack is being charged or discharged, determining, by the control unit, internal resistances of the first to $n^{th}$ battery packs from the periodically measured voltage data and current data for each battery pack; calculating, by the control unit, an average value of the internal resistances; and determining, by the control unit, occurrence of an open failure at the switch unit included in the identified battery pack based further on an internal resistance of the identified battery pack being different from the average internal resistance by less than a second threshold value.

Preferably, the method may comprise determining, by the control unit, occurrence of the open failure at the switch unit included in the identified battery pack based further on the pack current of the identified battery pack having a magnitude smaller than the average pack current by at least 1.0 $\sigma_{current}$, wherein $\sigma_{current}$ is a standard deviation of the pack currents of the first to $n^{th}$ battery packs.

More preferably, the method may comprise determining, by the control unit, occurrence of the open failure at the switch unit included in the identified battery pack based further on the internal resistance of the identified battery pack being different from the average internal resistance by less than 2.0 $\sigma_R$, wherein $\sigma_R$ is a standard deviation of the internal resistances of the first to $n^{th}$ battery packs, and the pack current of the identified battery pack having a magnitude smaller than the average pack current by at least 1.0 $\sigma_{current}$, wherein $\sigma_{current}$ is a standard deviation of the pack currents of the first to $n^{th}$ battery packs.

In an embodiment, the method may include outputting, by the control unit, the information about the identified battery pack through a display unit, a notification unit or a communication unit.

Advantageous Effects

According to the present disclosure, unlike a conventional switch unit diagnosing method, an open failure of a switch unit included in a multi battery pack in which a plurality of battery packs are connected in parallel may be reliably diagnosed. In addition, while an open failure of the switch unit is being diagnosed, degradation of the battery pack may also be diagnosed together.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 4 is a diagram schematically showing the flow of a precharge current when a low-potential relay M− and a precharge switch FS are turned on in a state where switch units S1 to Sn included in each battery pack are turned on.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

In the embodiments described below, a battery cell refers to a lithium secondary battery. Here, the lithium secondary battery collectively refers to a secondary battery in which lithium ions act as operating ions during charging and discharging to cause an electrochemical reaction at a positive electrode and a negative electrode.

Meanwhile, even if the name of the secondary battery changes depending on the type of electrolyte or separator used in the lithium secondary battery, the type of packaging material used to package the secondary battery, and the interior or exterior structure of the lithium secondary battery, as long as lithium ions are used as operating ions the secondary battery should be interpreted as being included in the category of the lithium secondary battery.

The present disclosure may also be applied to other secondary batteries other than the lithium secondary battery. Therefore, even if the operating ions are not lithium ions, any secondary battery to which the technical idea of the present disclosure may be applied should be interpreted as being included in the category of the present disclosure regardless of its type.

In addition, it should be noted in advance that the battery cell may refer to one unit cell or a plurality of unit cells connected in parallel.

Figure 3:
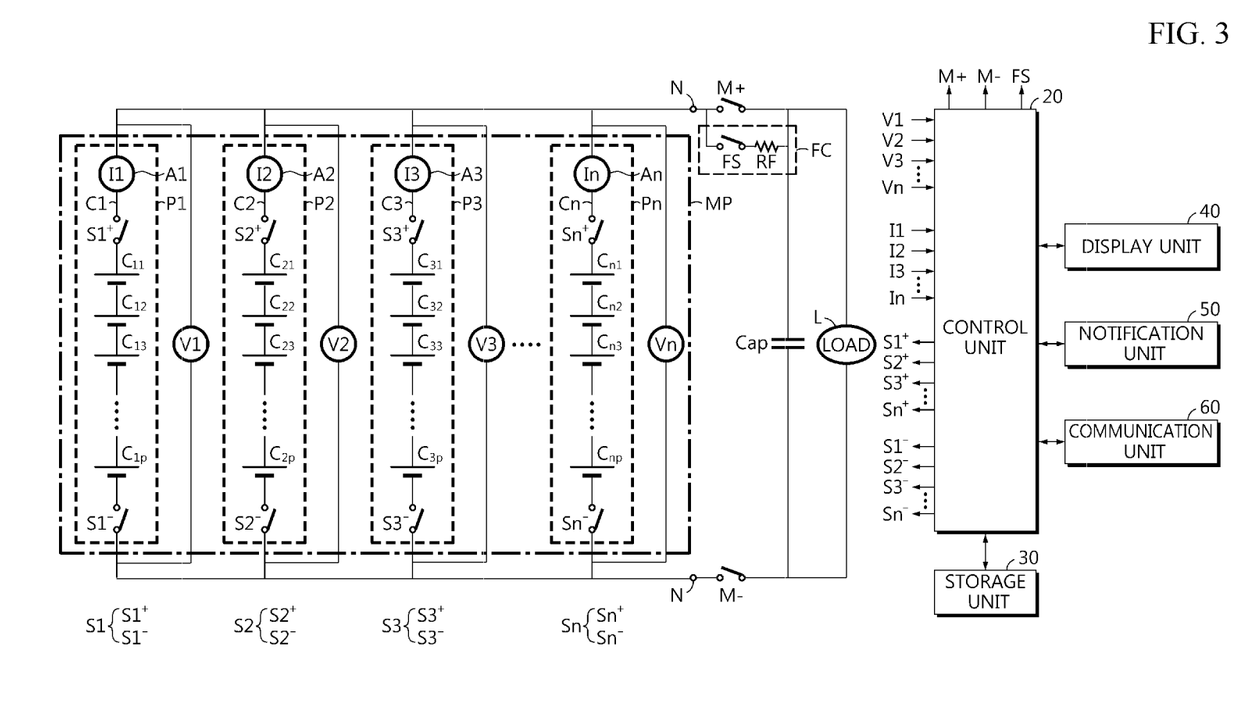
FIG. 3 is a block diagram showing an apparatus for diagnosing a failure of a switch unit included in a multi battery pack according to an embodiment of the present disclosure.

FIG. 3 is a block diagram showing an apparatus for diagnosing a failure of a switch unit included in a multi battery pack (hereinafter, also referred to as a diagnosing apparatus) according to an embodiment of the present disclosure.

Referring to FIG. 3, the diagnosing apparatus 10 according to an embodiment of the present disclosure is a device for diagnosing a failure of switch units S1 to Sn included in a multi battery pack MP in which first to $n^{th}$ battery packs P1 to Pn are connected in parallel through a parallel link node N.

The multi battery pack MP may be connected to a load L through a high-potential relay M+ and a low-potential relay M−. The load L is a device that receives power from the multi battery pack MP, and may be an inverter included in an electric vehicle as an example. The inverter is a power conversion circuit that is installed at a front end of an electric motor of an electric vehicle to convert a DC current supplied from the multi battery pack MP into a 3-phase AC current and supplies the 3-phase AC current to the electric motor. The type of the load L is not limited to the inverter, and any device or instrument capable of receiving power from the multi battery pack MP may be included in the category of the load L regardless of its type.

If the high-potential relay M+ and the low-potential relay M− are turned on, the multi battery pack MP is electrically connected to the load L. Conversely, if the high-potential relay M+ and the low-potential relay M− are turned off, the electrical connection between the multi battery pack MP and the load L is released.

Each of the first to $n^{th}$ battery packs P1 to Pn includes a plurality of battery cells connected in series therein. That is, the first battery pack P1 includes first to $p^{th}$ battery cells $C_{11}$ to $C_{1p}$ connected in series. In addition, the second battery pack P2 includes first to $p^{th}$ battery cells $C_{21}$ to $C_{2p}$ connected in series. In addition, the third battery pack P3 includes first to $p^{th}$ battery cells $C_{31}$ to $C_{3p}$ connected in series. In addition, the $n^{th}$ battery pack Pn includes first to $p^{th}$ battery cells $C_{n1}$ to $C_{np}$ connected in series. In addition, though fourth to $n-1^{th}$ battery packs are not shown in the drawing, each of the fourth to $n-1^{th}$ battery packs includes a p number of battery cells connected in series in the same manner as the illustrated battery packs.

Each of the first to $n^{th}$ battery packs P1 to Pn includes the switch units S1 to Sn therein. That is, the first battery pack P1 includes a first switch unit S1. In addition, the second battery pack P2 includes a second switch unit S2. In addition, the third battery pack P3 includes a third switch unit S3. In addition, the $n^{th}$ battery pack Pn includes an $n^{th}$ switch unit Sn. In addition, though the fourth to $n-1^{th}$ battery packs are not shown in the drawing, each of the fourth to $n-1^{th}$ battery packs includes a switch unit in the same manner as the illustrated battery packs.

Each of the first to $n^{th}$ switch units S1 to Sn includes a low-potential switch and a high-potential switch. That is, the first switch unit S1 includes a first high-potential switch $S1^+$ installed at a high-potential side of the first battery pack P1 and a first low-potential switch $S1^-$ installed at a low-potential side of the first battery pack P1. In addition, the second switch unit S2 includes a second high-potential switch $S2^+$ installed at a high-potential side of the second battery pack P2 and a second low-potential switch $S2^-$ installed at a low-potential side of the second battery pack P2. In addition, the third switch unit S3 includes a third high-potential switch $S3^+$ installed at a high-potential side of the third battery pack P3 and a third low-potential switch $S3^-$ installed at a low-potential side of the third battery pack P3. In addition, the $n^{th}$ switch unit Sn includes an $n^{th}$ high-potential switch $Sn^+$ installed at a high-potential side of the $n^{th}$ battery pack Pn and an $n^{th}$ low-potential switch $Sn^-$ installed at a low-potential side of the $n^{th}$ battery pack Pn. Meanwhile, though the fourth to $n-1^{th}$ battery packs are not shown in the drawing, each of the fourth to $n-1^{th}$ battery packs includes a high-potential switch and a low-potential switch in the same manner as the illustrated battery pack. In addition, in each switch unit, any one of the high-potential switch and the low-potential switch may be omitted.

In the present disclosure, the switch units S1 to Sn may be a semiconductor switch such as a MOSFET or a mechanical switch such as a relay, but the present disclosure is not limited thereto.

The diagnosing apparatus 10 according to an embodiment of the present disclosure includes a precharge circuit FC. The precharge circuit FC includes a precharge resistor RF and a precharge switch FS connected in series, and is connected in parallel to the parallel link node N.

Generally, a capacitor Cap is provided at a front end of the load L. The capacitor Cap is connected in parallel between the multi battery pack MP and the load L. The capacitor Cap functions as a filter to prevent a noise signal from being applied toward the load L.

If the multi battery pack MP is connected to the load L, an in-rush current flows from the multi battery pack MP to the capacitor Cap for a short time. The precharge circuit FC is an auxiliary circuit to prevent the in-rush current from flowing to the load when the multi battery pack MP is connected to the load L.

When the multi battery pack MP is connected to the load L, the low-potential relay M− is turned on first, and then the precharge switch FS of the precharge circuit FC is turned on. If so, a discharging current starts flowing from the multi battery pack MP to the capacitor Cap through the precharge resistor RF. In addition, when a predetermined time passes and the capacitor Cap is completely charged by the discharging current, the high-potential relay M+ is turned on and the precharge switch FS is turned off. If so, the discharging current stably flows from the multi battery pack MP to the load L. The predetermined time may be predetermined by a time constant determined by the precharge resistor RF included in the precharge circuit FC and the capacitor Cap. Preferably, the predetermined time may be set as 1 to 2 times of the time constant.

The diagnosing apparatus 10 according to an embodiment of the present disclosure includes first to $n^{th}$ current sensors I1 to In installed on power lines connected to the first to $n^{th}$ battery packs P1 to Pn, respectively, to measure a current flowing through each battery pack. That is, the first current sensor I1 measures the magnitude of current flowing through the first battery pack P1. In addition, the second current sensor 12 measures the magnitude of current flowing through the second battery pack P2. In addition, the third current sensor 13 measures the magnitude of current flowing through the third battery pack P3. The $n^{th}$ current sensor In measures the magnitude of current flowing through the $n^{th}$ battery pack Pn. Although not shown in the drawing, the fourth to $n-1^{th}$ current sensors measure the magnitude of currents flowing through the fourth to $n-1^{th}$ battery packs, respectively. In the drawing, it is shown that first to $n^{th}$ current sensors I1 to In are included in the battery packs, respectively. However, in the present disclosure, the first to $n^{th}$ current sensors I1 to In may also be installed outside the battery packs, without limitation.

The first to $n^{th}$ current sensors I1 to In may be Hall sensors. The Hall sensor is a known current sensor that outputs a voltage signal corresponding to the magnitude of a current. In another example, the first to $n^{th}$ current sensors I1 to In may be sense resistors. If the voltage applied to both ends of the sense resistor is measured, the magnitude of current flowing through the sense resistor may be determined using Ohm's law. In other words, if the magnitude of the measured voltage is divided by a known resistance value of the sense resistor, the magnitude of current flowing through the sense resistor may be determined.

The diagnosing apparatus 10 according to an embodiment of the present disclosure includes first to $n^{th}$ voltage sensors V1 to Vn respectively installed at the first to $n^{th}$ battery packs P1 to Pn to measure a voltage for each battery pack. The first voltage sensor V1 measures the voltage between the positive electrode terminal and the negative electrode terminal of the first battery pack P1. In addition, the second voltage sensor V2 measures the voltage between the positive electrode terminal and the negative electrode terminal of the second battery pack P2. In addition, the third voltage sensor V3 measures the voltage between the positive electrode terminal and the negative electrode terminal of the third battery pack P3. In addition, the $n^{th}$ voltage sensor Vn measures the voltage between the positive electrode terminal and the negative electrode terminal of the $n^{th}$ battery pack Pn. Although not shown in the drawing, the fourth to $n-1^{th}$ voltage sensors measures the voltage between the positive electrode terminal and the negative electrode terminal of the fourth to $n-1^{th}$ battery packs, respectively.

The first to $n^{th}$ voltage sensors V1 to Vn include a voltage measurement circuit such as a differential amplifier circuit. Since the voltage measurement circuit is well known in the art, the voltage measurement circuit will not be described in detail here.

The diagnosing apparatus 10 according to the present disclosure includes a control unit 20 operatively coupled to the first to $n^{th}$ switch units S1 to Sn, the precharge switch FS, the first to $n^{th}$ current sensors I1 to In, and the first to $n^{th}$ voltage sensors V1 to Vn.

In an embodiment, the control unit 20 may diagnose a failure of the switch unit included in each battery pack and/or degradation of the battery pack while the precharge current is being discharged from the multi battery pack MP.

However, it is obvious to those skilled in the art that the present disclosure may be applied to diagnose a failure of the switch unit included in each battery pack and/or degradation of the battery pack while the multi battery pack MP is being discharged or charged.

According to an embodiment, immediately before the multi battery pack MP is connected to the load L, the control unit 20 turns on the low-potential relay M− and turns on the first to $n^{th}$ switch units S1 to Sn and the precharge switch FS. If so, the precharge current flows through the precharge resistor RF to the capacitor Cap connected in parallel between the load L and the multi battery pack MP.

Figure 4:
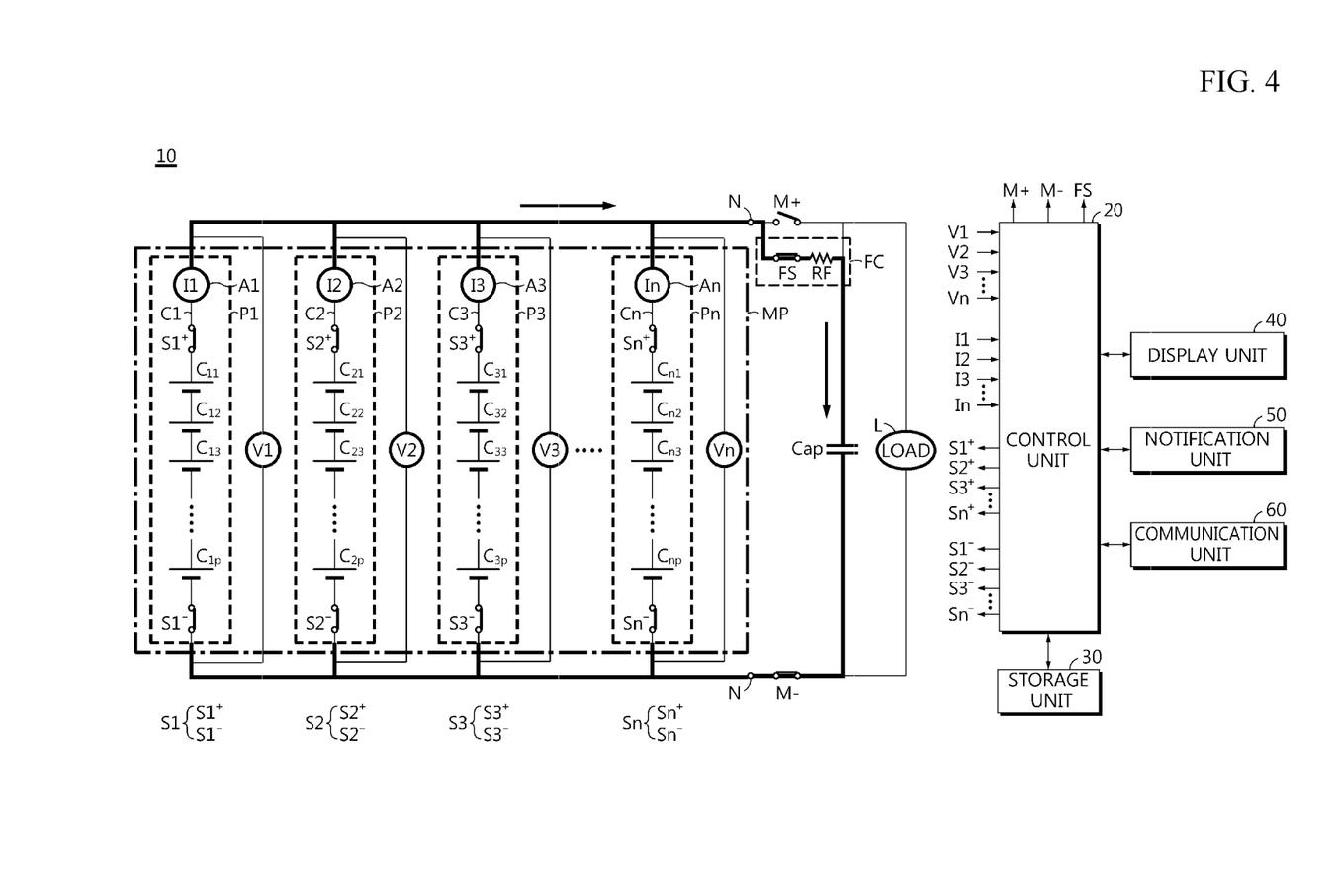

FIG. 4 is a diagram schematically showing the flow of a precharge current when the low-potential relay M− and the precharge switch FS are turned on in a state where the switch units S1 to Sn included in each battery pack are turned on.

In FIG. 4, a conductive wire through which a precharge current flows is indicated by a thick solid line, and an arrow indicates a direction in which the precharge current flows. The magnitude of the precharge current gradually increases and is saturated over time.

The precharge current is a sum current of the pack currents discharged from the first to $n^{th}$ battery packs P1 to Pn, and the magnitude of the pack current of a $k^{th}$ battery pack Pk varies with time according to Equation 1 below.

$$I_k = (V_{pack,k}/R_{in,k}) \text{Exp}(-t/RC) \qquad \text{<Equation 1>}$$

Here, $I_k$ is the magnitude of the pack current flowing from the $k^{th}$ battery pack Pk to the capacitor Cap. k is a natural number of 1 to n. $V_{pack,k}$ is the voltage for the $k^{th}$ battery pack Pk, which is a voltage value measured by the $k^{th}$ voltage sensor Vk. $R_{in,k}$ is the internal resistance of the $k^{th}$ battery pack Pk. The method of calculating internal resistance will be described later. t is the time. R is the resistance of the precharge resistor RF. C is the capacitance of the capacitor Cap connected in parallel between the multi battery pack MP and the load L. R and C are parameters whose values are preset. Exp ( ) is an exponential function of a natural logarithm e.

The control unit 20 measures the n number of pack currents $I_k$ (k is 1 to n) flowing from each battery pack to the capacitor Cap by using the first to $n^{th}$ current sensors I1 to In at a time point when a preset time passes after turning on the precharge switch FS, and record the same in the storage unit 30. In a modified example, the pack current $I_k$ may be measured at a preset diagnosis time point while the multi battery pack MP is being charged or discharged.

In addition, the control unit 20 calculates an average value ($\text{Avr}_{current}$) and standard deviation ($\sigma_{current}$) of the n number of measured pack currents and records the same in the storage unit 30.

In addition, the control unit 20 identifies a battery pack whose pack current $I_k$ has a magnitude smaller than the average value by a threshold value or more. In addition, the control unit 20 determines that an open failure occurs at the switch unit included in the identified battery pack, and outputs information (e.g., ID) about the corresponding battery pack.

Preferably, the control unit 20 identifies a battery pack whose pack current $I_k$ has a magnitude different from the average value ($\text{Avr}_{current}$) by $\alpha*\sigma_{current}$ or more, namely smaller than the average value ($\text{Avr}_{current}$) by $\alpha*\sigma_{current}$ or more, and determines that an open failure occurs at the switch unit included in the identified battery pack. α has a value between 1.0 and 2.0, and is preferably 1.5. In addition, the control unit 20 outputs the information (e.g., ID) about the battery pack including the switch unit in which the open failure occurs. The embodiment related to the output will be described later.

According to another embodiment, the control unit 20 periodically measure the current flowing through each battery pack and the voltage applied between the positive electrode terminal and the negative electrode terminal by using the first to $n^{th}$ current sensors I1 to In and the first to $n^{th}$ voltage sensors V1 to Vn while the multi battery pack MP is being charged or discharged, and record the same in the storage unit 30.

In addition, the control unit 20 determines the n number of internal resistances $R_{in,k}$ (k is 1 to n) for the first to $n^{th}$ battery packs P1 to Pn from the plurality of voltage data and the plurality of current data measured for each battery pack, and records the same in the storage unit 30. In addition, the control unit 20 calculates an average value $\text{Avr}_R$ and standard deviation $\sigma_R$ of the n number of internal resistances $R_{in,1}$ to $R_{in,n}$ and records the same in the storage unit 30.

If the control unit 20 calculates the internal resistance $R_{in,k}$ of each battery pack and the average value $\text{Avr}_R$ and standard deviation $\sigma_R$ of the n number of internal resistances $R_{in,1}$ to $R_{in,n}$, the open failure diagnosis logic of the switch unit may be modified as follows.

Specifically, the control unit 20 identifies a battery pack whose internal resistance $R_{in,k}$ is different from the average value $\text{Avr}_R$ by less than a threshold value and whose pack current $I_k$ has a magnitude different from the average value by a threshold value or more. In addition, the control unit 20 determines that an open failure occurs at the switch unit included in the identified battery pack, and outputs information (e.g., ID) about the corresponding battery pack.

Preferably, the control unit 20 identifies a battery pack whose internal resistance $R_{in,k}$ is different from the average value $\text{Avr}_R$ by less than $\beta*\sigma_R$, namely whose internal resistance $R_{in,k}$ is not greater than the average value $\text{Avr}_R$ by $\beta*\sigma_R$ or more, and whose pack current $I_k$ has a magnitude different from the average value $\text{Avr}_{current}$ by $\alpha*\sigma_{current}$ or more, namely whose pack current $I_k$ has a magnitude smaller than the average value $\text{Avr}_{current}$ by $\alpha*\sigma_{current}$ or more. 13 has a value between 1.0 and 2.0, and is preferably 1.5. In addition, the control unit 20 determines that an open failure occurs at the switch unit included in the identified battery pack, and outputs information (e.g., ID) about the corresponding battery pack.

In another embodiment, the diagnosing apparatus 10 according to an embodiment of the present disclosure may include a display unit 40. In addition, the control unit 20 may visually output the information about the battery pack including the switch unit at which an open failure occurs through the display unit 40. In addition, the control unit 20 may visually output the information about the battery pack whose internal resistance increases by a threshold value or more due to degradation through the display unit 40.

In an example, the display unit 40 may be a liquid crystal display or an organic light emitting diode display.

The display unit 40 is not necessarily included in the diagnosing apparatus 10, and may be included in another device. In this case, the control unit 20 is not directly connected to the display unit 40, but is indirectly connected to the display unit 40 through a control means included in another device. Therefore, it should be understood that the electrical connection between the display unit 40 and the control unit 20 also includes such an indirect connection.

Meanwhile, if the control unit 20 is not able to directly display the information about the battery pack including the switch unit at which an open failure occurs or the information about a degraded battery pack whose internal resistance increases by the threshold value or more, the control unit 20 may provide the diagnosis information to another device including a display unit. In this case, the control unit 20 may be connected to another device to enable data transmission, the another device may receive the information about the battery pack including the switch unit at which an open failure occurs or the information about a degraded battery pack whose internal resistance increases by the threshold value or more, and the another device may display the received information about the battery pack through a display unit connected thereto as a graphic user interface.

In still another embodiment, the diagnosing apparatus 10 according to an embodiment of the present disclosure may include a notification unit 50. In addition, the control unit 20 may audibly output the information about the battery pack including the switch unit at which an open failure occurs through the notification unit 50. In addition, the control unit 20 may audibly output the information about the degraded battery pack whose internal resistance increases by the threshold value or more due to degradation through the notification unit 50.

The information output through the notification unit 50 may be a voice message indicating that a failure occurs at the switch unit and thus the battery pack needs to be inspected. The voice message may include a message indicating that a degraded battery pack whose internal resistance increases by the threshold value or more needs to be inspected. Alternatively, the notification unit 50 may simply output a preset warning sound.

If the notification unit 50 is a means capable of outputting sound, there is no special limitation on its type. In an example, the notification unit 50 may be a speaker or a buzzer.

In still another embodiment, the diagnosing apparatus 10 according to an embodiment of the present disclosure may include a communication unit 60. In addition, the control unit 20 may transmit the information about the battery pack including the switch unit at which an open failure occurs to an external device through the communication unit 60. In addition, the control unit 20 may transmit the information about a degraded battery pack whose internal resistance increases by the threshold value or more due to degradation to an external device through the communication unit 60.

Preferably, the communication unit 60 may be a communication interface capable of transmitting or receiving communication data. The communication interface may support CAN (Controller Area Network), LIN (Local Interconnect Network), FlexRay or MOST (Media Oriented Systems Transport) communication. Advantageously, the communication interface may support wired and/or wireless communication.

The control unit 20 may generate communication data including the information (e.g., ID) about the battery pack including the switch unit at which an open failure occurs or about a degraded battery pack whose internal resistance increases by the threshold value or more due to degradation, and then output the generated communication data through the communication unit 60. The communication data may be transferred to a control unit included in an external device through a communication network. After receiving the communication data, the control unit of the external device may extract the information (e.g., ID) about the battery pack including the switch unit at which an open failure occurs or about a degraded battery pack whose internal resistance increases by the threshold value or more due to degradation from the communication data, and visually display the extracted information on a display unit connected to the external device. For example, the external device may be a dedicated diagnosing apparatus capable of diagnosing an open failure of the switch unit and/or degradation of the battery pack or a main control computer of a load equipped with the first to $n^{th}$ battery packs P1-Pn, for example an electric vehicle.

In the present disclosure, there is no particular limitation on the type of the storage unit 30 as long as it is a storage medium capable of recording and erasing information. As an example, the storage unit 30 may be a random-access memory (RAM), a read-only memory (ROM), an electrically erasable programmable read-only memory (EE-PROM), a register, or a flash memory. The storage unit 30 may also be electrically connected to the control unit 20 through, for example, a data bus so as to be accessed by the control unit 20.

The storage unit 30 also stores and/or updates and/or erases and/or transmits a program including various control logics performed by the control unit 20, and/or data generated when the control logic is executed. The storage unit 30 may be logically divided into two or more parts and may be included in the control unit 20 without limitation.

In the present disclosure, the control unit 20 may control the first to $n^{th}$ voltage sensors V1 to Vn, receive voltage measurement signals V1 to Vn from the first to $n^{th}$ voltage sensors V1 to Vn to determine a voltage of each battery pack, and record the same in the storage unit 30. In addition, the control unit 20 may control the first to $n^{th}$ current sensors I1 to In, receive current measurement signals I1 to In from the first to $n^{th}$ current sensors I1 to In to determine the magnitude of current flowing through each battery pack, and record the same in the storage unit 30. Also, the control unit 20 may output signals S1 to Sn$^+$ and S1$^-$ to Sn$^-$, which are switch control signals for controlling the turn-on or turn-off operation of the switch units S1 to Sn included in each battery pack. Here, the S1$^+$ to Sn$^+$ signals are signals for controlling the high-potential switches, and the S1$^-$ to Sn$^-$ signals are signals for controlling the low-potential switches.

In the present disclosure, the control unit 20 may optionally include a processor, an application-specific integrated circuit (ASIC), another chipset, a logic circuit, a register, a communication modem, a data processing device, or the like, known in the art to execute the various control logics described above. In addition, when the control logic is implemented in software, the control unit 20 may be implemented as a set of program modules. At this time, the program module may be stored in a memory and executed by a processor. The memory may be provided inside or outside the processor and be connected to the processor through various well-known computer components. Also, the memory may be included in the storage unit 30. In addition, the memory refers to a device in which information is stored, regardless of the type of device, and does not refer to a specific memory device.

In addition, one or more of the various control logics of the control unit 20 may be combined, and the combined control logics may be written in a computer-readable code system and recorded in a computer-readable recording medium. The recording medium is not particularly limited as long as it is accessible by a processor included in a computer.

As an example, the storage medium includes at least one selected from the group consisting of a ROM, a RAM, a register, a CD-ROM, a magnetic tape, a hard disk, a floppy disk and an optical data recording device. The code scheme may be distributed to a networked computer to be stored and executed therein. In addition, functional programs, codes and code segments for implementing the combined control logics may be easily inferred by programmers in the art to which the present disclosure belongs.

Figure 9:
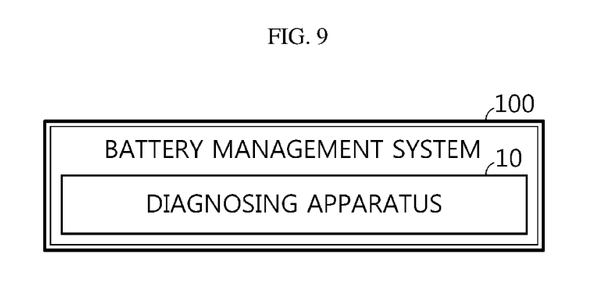
FIG. 9 is a block diagram showing a battery management system including the diagnosing apparatus according to an embodiment of the present disclosure.

The diagnosing apparatus 10 according to the present disclosure may be included in a battery management system 100 as shown in FIG. 9. The battery management system 100 controls the overall operation related to charging and discharging of a battery, and is a computing system called a battery management system (BMS) in the art.

Figure 10:
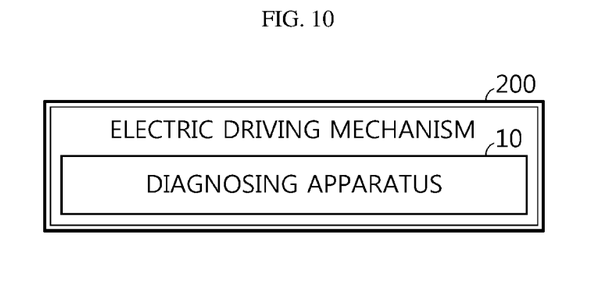
FIG. 10 is a block diagram showing an electric driving mechanism including the diagnosing apparatus according to an embodiment of the present disclosure.

In addition, the diagnosing apparatus 10 according to the present disclosure may be mounted to various types of electric driving mechanism 200 as shown in FIG. 10.

According to an embodiment, the electric driving mechanism 200 may be a mobile computer device such as a mobile phone, a laptop computer and a tablet computer, or a handheld multimedia device such as a digital camera, a video camera and an audio/video reproduction device.

According to another embodiment, the electric driving mechanism 200 may be an electric power device movable by electricity, such as an electric vehicle, a hybrid electric vehicle, an electric bicycle, an electric motorcycle, an electric train, an electric ship and an electric plane, or a power tool having a motor, such as an electric drill and an electric grinder.

Figure 5:
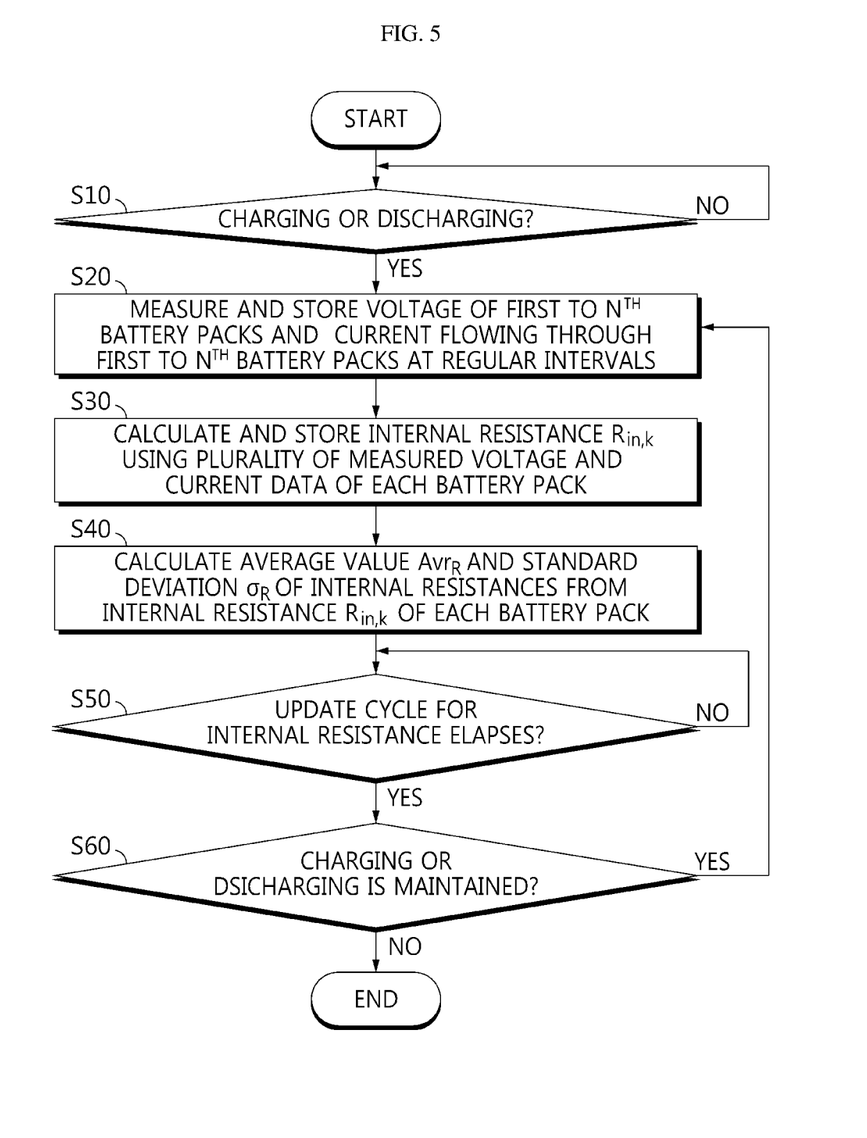
FIG. 5 is a flowchart for specifically illustrating a method for periodically calculating an internal resistance of each battery pack included in a multi battery pack by a control unit according to an embodiment of the present disclosure.

FIG. 5 is a flowchart for specifically illustrating a method for periodically calculating an internal resistance of each battery pack included in the multi battery pack MP by the control unit 20 according to an embodiment of the present disclosure.

As shown in FIG. 5, in Step S10, the control unit 20 determines whether the multi battery pack MP is being charged or discharged.

In Step S10, the control unit 20 monitors the magnitude of a current flowing through a conductive wire using a current sensor (not shown) installed on the conductive wire through which a charging current or a discharging current flows, and if the magnitude of the current is above a certain level, the control unit 20 determines that the multi battery pack MP is being charged or discharged.

While the multi battery pack MP is being charged or discharged, the control unit 20 maintains the switch units S1 to Sn included in each battery pack and the high-potential relay M+ and the low-potential relay M− in a turn-on state, and maintains the precharge switch FS in a turn-off state.

If the determination result in Step S10 is YES, the control unit 20 shifts the process to Step S20.

In Step S20, the control unit 20 measures currents flowing through the first to $n^{th}$ battery packs P1 to Pn and voltages of the first to $n^{th}$ battery packs P1 to Pn at regular time intervals by using the first to $n^{th}$ current sensors I1 to In and the first to $n^{th}$ voltage sensors V1 to Vn, and records the same in the storage unit 30. Step S30 proceeds after Step S20.

In Step S30, the control unit 20 calculates an internal resistance $R_{in,k}$ of each battery pack by using the plurality of voltage data and current data recorded in the storage unit 30, and records the same in the storage unit 30.

The internal resistance $R_{in,k}$ is calculated from an absolute value of a slope of an I-V line calculated by linear regression analysis on the plurality of voltage data and current data measured for each battery pack. The method of calculating an internal resistance is well known in the art and thus will not be described in detail here. Step S40 proceeds after Step S30.

In Step S40, the control unit 20 calculates an average value $Avr_R$ and standard deviation $\sigma_R$ of the n number of internal resistances by statistically analyzing the internal resistance $R_{in,k}$ of each battery pack, and records the same in the storage unit 30. Step S50 proceeds after Step S40.

In Step S50, the control unit 20 determines whether an update cycle for the internal resistance has elapsed.

If the determination result of Step S50 is YES, in Step S60, the control unit 20 determines whether charging or discharging of the multi battery pack MP is being maintained. Meanwhile, if the determination result in Step S50 is NO, the control unit 20 defers the process.

If the determination result of Step S60 is YES, the control unit 20 proceeds to Step S20 to repeat the process of calculating the internal resistance $R_{in,k}$ of each battery pack and calculating the average value $Avr_R$ and standard deviation $\sigma_R$ of the n number of internal resistances. Meanwhile, if the determination result of Step S60 is NO, the control unit 20 ends the logic for calculating the internal resistance of each battery pack.

Figure 6:
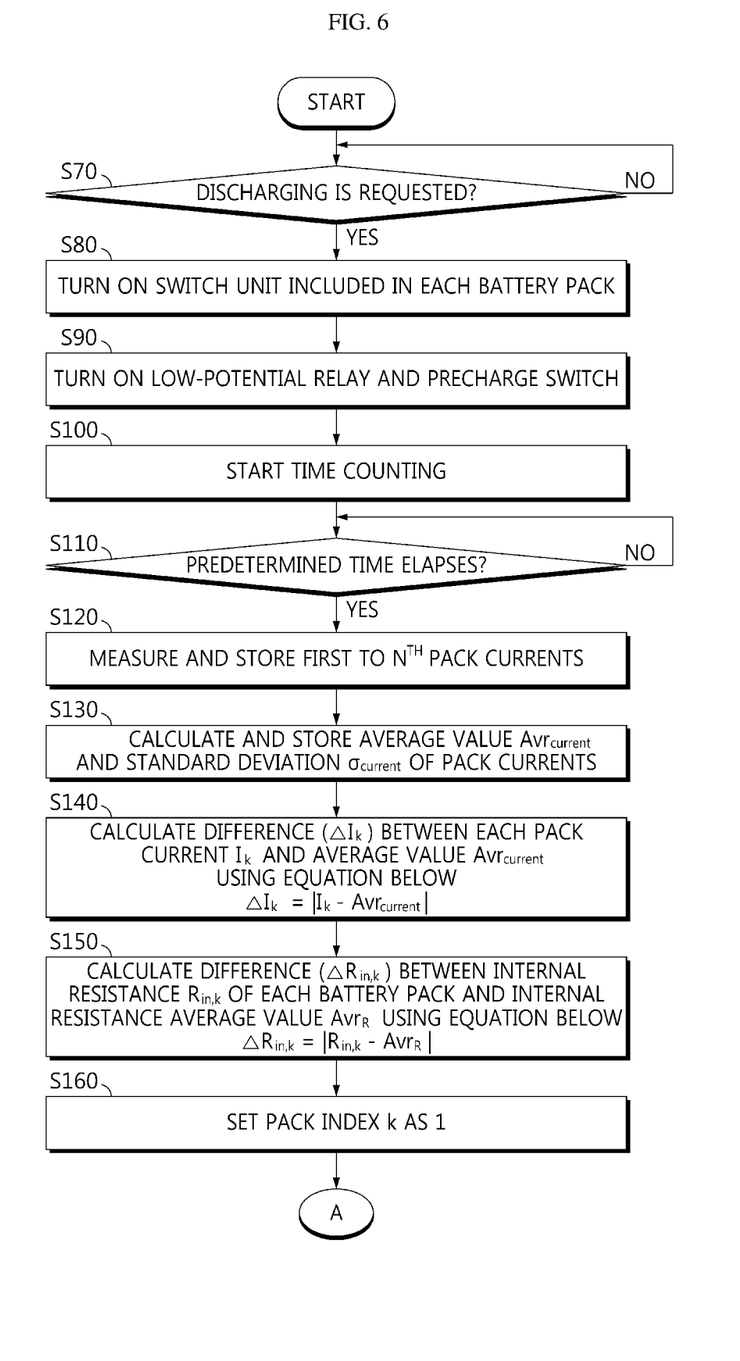
FIGS. 6 and 7 are flowcharts for specifically illustrating a method for diagnosing a failure of a switch unit included in each battery pack of a multi battery pack and/or degradation of the battery pack by the control unit according to an embodiment of the present disclosure.
Figure 7:
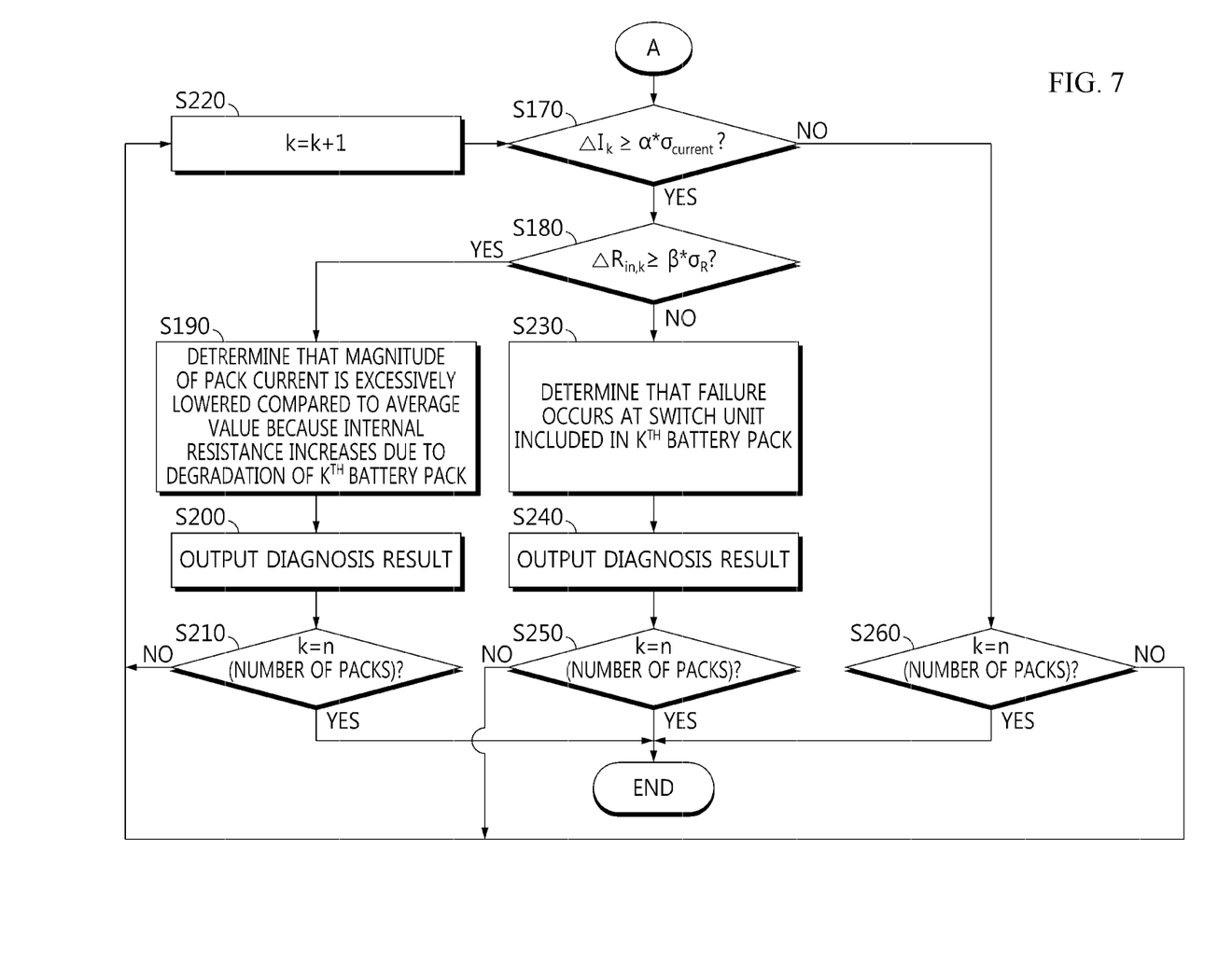

FIGS. 6 and 7 are flowcharts for specifically illustrating a method for diagnosing a failure of the switch unit included in each battery pack of the multi battery pack MP and/or degradation of the battery pack by the control unit 20 according to an embodiment of the present disclosure.

The embodiment of the present disclosure diagnoses a failure of the switch unit included in each battery pack and/or the degradation of the battery pack while a precharge current is being discharged from the multi battery pack MP.

However, it is obvious to those skilled in the art that the present disclosure can be applied to diagnose a failure of the switch unit included in each battery pack and/or degradation of the battery pack while the multi battery pack MP is being discharged or charged.

As shown in FIG. 6, in Step S70, the control unit 20 determines whether there is a discharging request from a control device that manages the load L. To this end, the control unit 20 monitors whether a discharging request message is received from the control device of the load L by means of the communication unit 60.

If it is determined in Step S70 that there is a discharging request from the control device of the load L, the control unit 20 shifts the process to Step S80. Meanwhile, if it is determined in Step S70 that there is no discharging request, the control unit 20 defers the process.

In Step S80, the control unit 20 turns on the first to $n^{th}$ switch units S1 to Sn respectively included in the first to $n^{th}$ battery packs P1 to Pn. Step S90 proceeds after Step S80.

In Step S90, the control unit 20 turns on the low-potential relay M− of the multi battery pack MP and the precharge switch FS included in the precharge circuit FC.

If Step S90 proceeds, a pack current flows from the first to $n^{th}$ battery packs P1 to Pn to the capacitor Cap connected in parallel between the multi battery pack MP and the load L. Here, the pack current corresponds to the precharge current. Step S100 proceeds after Step S90.

In Step S100, the control unit 20 starts time counting. In addition, in Step S110, the control unit 20 determines whether a predetermined time has elapsed by referring to the time count value. The predetermined time is preset in consideration of a time constant obtained by multiplying the resistance of the precharge resistor RF included in the precharge circuit FC and the capacitance of the capacitor Cap connected in parallel between the multi battery pack MP and the load L. For example, the predetermined time may be set as 1 to 2 times of the time constant.

If the determination result of Step S110 is YES, the control unit 20 shifts the process to Step S120.

In Step S120, the control unit 20 measures the magnitude of the first to $n^{th}$ pack currents $I_k$ (k is 1 to n) flowing from the first to $n^{th}$ battery packs P1 to Pn to the capacitor Cap by using the first to $n^{th}$ current sensors I1 to In, and record the same in the storage unit 30. Step S130 proceeds after Step S120. Here, the pack current $I_k$ is measured for each battery pack, so the number of measured pack currents is n.

In Step S130, the control unit 20 calculates the average value $Avr_{current}$ and standard deviation $\sigma_{current}$ of the n number of measured pack currents $I_k$ (k is 1 to n), and records the same in the storage unit 30. Step S140 proceeds after Step S130.

In Step S140, the control unit 20 calculates a difference ($\Delta I_k$) between each pack current value $I_k$ and the average value $Avr_{current}$ using the following equation. Step S150 proceeds after Step S140. The number of $\Delta I_k$ calculated in Step S140 is n.

$$\Delta I_k = |I_k - Avr_{current}| (k \text{ is } 1 \text{ to } n) \qquad \text{<Equation 2>}$$

In Step S150, the control unit 20 calculates a difference ($\Delta R_{in,k}$) between the internal resistance $R_{in,k}$ of each battery pack and the internal resistance average value $Avr_R$ using the following equation. Step S160 proceeds after Step S150. The number of $\Delta R_{in,k}$ calculated in Step S150 is n.

$$\Delta R_{in,k} = |R_{in,k} - Avr_R| \qquad \text{<Equation 3>}$$

In Step S160, the control unit 20 sets the pack index k as 1 to diagnose the switch units included in each battery pack. Step S170 of FIG. 7 proceeds after Step S160.

Referring to FIG. 7, in Step S170, the control unit 20 determines whether $\Delta I_1$ for the first battery pack is greater than or equal to $\alpha^* \sigma_{current}$. Here, a has a value between 1.0 and 2.0, and may be preferably 1.5.

If the determination result of Step S170 is YES, namely if the magnitude of the pack current flowing from the first battery pack to the capacitor Cap is smaller than the average value by $\alpha^* \sigma_{current}$ or more, the control unit 20 shifts the process to Step S180.

For reference, in a state where an open failure occurs at the switch unit, the magnitude of the pack current flowing from the battery pack including the corresponding switch unit to the capacitor Cap is decreased close to zero. Therefore, the magnitude of the pack current is smaller than the average value.

In Step S180, the control unit 20 determines whether $\Delta R_{in,k}$ is greater than or equal to $\beta^* \sigma_R$. Here, β has a value between 1.0 and 2.0, and may be preferably 1.5.

If the determination result of Step S180 is YES, namely if the internal resistance $R_{in,1}$ of the first battery pack is greater than the average value $Avr_R$ of the internal resistances by $\beta^* \sigma_R$ or more, the control unit 20 shifts the process to S190.

Here, if the internal resistance $R_{in,1}$ of the first battery pack is greater than the average value $Avr_R$ of the internal resistances by $\beta^* \sigma_R$ or more, it means that the degree of degradation of the battery pack is considerably greater than that of the remaining battery packs. In this case, the magnitude of the pack current flowing from the battery pack to the capacitor Cap is considerably smaller than the average value.

In Step S190, the control unit 20 determines that the magnitude of the pack current $I_1$ of the first battery pack is smaller than the average value $Avr_{current}$ by $\alpha^* \sigma_{current}$ or more because the internal resistance of the pack increases greater than the average value by $\beta^* \sigma_R$ or more, not due to the failure of the switch unit but due to the degradation of the first battery pack, thereby to decrease the magnitude of the pack current. Step S200 proceeds after Step S190.

The control unit 20 generates a diagnosis result in Step S200 and outputs the same through the display unit 40, the notification unit 50 or the communication unit 60. The diagnosis result includes information (e.g. ID) about the battery pack whose internal resistance is increased over the average value by the threshold value or more. Step S210 proceeds after Step S200.

The control unit 20 determines whether the value assigned to the pack index k is n in Step S210. Here, n is the number of total battery packs connected in parallel in the multi battery pack MP.

If the determination result of Step S210 is YES, the control unit 20 ends the diagnosis process according to the embodiment of the present disclosure. Meanwhile, if the determination result of Step S210 is NO, the control unit 20 increases the pack index k by 1 in Step S220, and then shifts the process to S170 to proceed with the diagnosis process for the switch unit included in the battery pack of the next order.

Meanwhile, if the determination result of Step S180 is NO, namely if the internal resistance $R_{in,1}$ of the first battery pack is not greater than the average value $Avr_R$ of the internal resistances by $\beta^* \sigma_R$ or more, the control unit 20 shifts the process to S230.

In Step S230, the control unit determines that the magnitude of the pack current $I_1$ of the first battery pack is smaller than the average value by $\alpha^* \sigma_{current}$ or more because an open failure occurs at the switch unit and thus the first battery pack is not properly discharged.

Here, the open failure means that the switch unit maintains a turn-off state even though a turn-on signal is applied to the switch unit. Step S240 proceeds after Step S230.

In Step S240, the control unit 20 generates a diagnosis result and outputs the same through the display unit 40, the notification unit 50 and the communication unit 60. The diagnosis result includes information (e.g., ID) about the battery pack in which an open failure occurs at the switch unit. Step S250 proceeds after Step S240.

In Step S250, the control unit 20 determines whether the value assigned to the pack index k is n. Here, n is the number of total battery packs connected in parallel in the multi battery pack MP.

If the determination result of Step S250 is YES, the control unit 20 ends the diagnosis process according to the embodiment of the present disclosure. Meanwhile, if the determination result of Step S250 is NO, the control unit 20 increases the pack index k by 1 in Step S220, and then shifts the process to S170 to proceed with the diagnosis process for the switch unit included in the battery pack of the next order.

If the determination result in Step S170 is NO, namely if the magnitude of the pack current $I_1$ of the first battery pack is different from the average value by less than $\alpha^* \sigma_{current}$, the control unit 20 determines that there is no failure at the switch unit and shifts the process to Step S260.

In Step S260, the control unit 20 determines whether the pack index k is equal to n. If the determination result of Step S260 is YES, the control unit 20 ends the diagnosis process according to the embodiment of the present disclosure. If the determination result of Step S260 is NO, the control unit 20 may increase the pack index k by 1 in Step S220 and return the process to Step S170.

The above process is repeated until the pack index k becomes equal to n. Therefore, not only the diagnosis of an open failure at the switch unit but also the diagnosis of the increase in internal resistance due to the degradation of the battery pack is repeated from the second battery pack to the $n^{th}$ battery pack.

Figure 8:
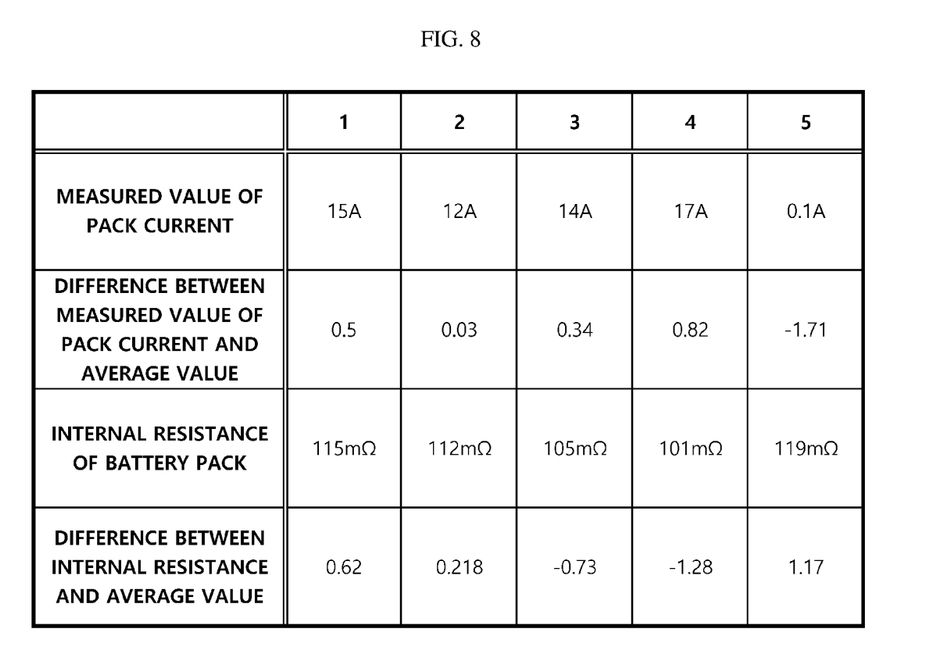
FIG. 8 is a table showing an embodiment where the present disclosure is applied to a multi battery pack in which five battery packs are connected in parallel.

FIG. 8 is a table showing an embodiment where the present disclosure is applied while a precharge current is being discharged from a multi battery pack MP in which five battery packs are connected in parallel.

Referring to FIG. 8, the average value $Avr_{current}$ and standard deviation $\sigma_{current}$ of the measured pack current values for the first to fifth battery packs are 11.62 A and 6.3 A, respectively. In the embodiment, $\alpha$ is set as 1.5. The difference between the measured value of the pack current and the average value is greatest for the fifth battery pack and reaches 1.71 times of a $\sigma_{current}$. For reference, a minus sign means that the measured value of the pack current is smaller than the average value, and a positive sign means that the measured value of the pack current is greater than the average value.

In addition, the average value $Avr_R$ and standard deviation $\sigma_R$ of the internal resistances of the first to fifth battery packs are 110.4 milliohms and 7.33 milliohms, respectively. In the embodiment, $\beta$ value is set as 1.5. The difference between the internal resistance and the average value is greatest for the fifth battery pack, but is 1.17 times of $\sigma_R$. For reference, a minus sign means that the internal resistance is smaller than the average value, and a plus sign means that the internal resistance is greater than the average value.

According to an embodiment, since the internal resistance of the fifth battery pack is not greater than the average value by 1.5 $\sigma_R$ or more and the measured value of the pack current is greater than the average value by 1.5 $\sigma_{current}$ or more, it may be determined that an open failure occurs at the switch unit included in the battery pack. The open failure refers to a case where an open failure occurs in at least one of the high-potential switch and the low-potential switch of the switch unit.

If the internal resistance of the fifth battery pack is greater than the average value by 1.5 $\sigma_R$ or more, it may be diagnosed that the measured pack current of the fifth battery pack is smaller than to the average value by 1.5 $\sigma_{current}$ or more because the internal resistance is increased not due to an open failure at the switch unit but due to excessive degradation of the battery pack.

According to the present disclosure, unlike a conventional switch unit diagnosis method, an open failure at a switch unit included in the multi battery pack in which a plurality of battery packs are connected in parallel may be reliably diagnosed. In addition, while an open failure at the switch unit is being diagnosed, degradation of the battery pack may also be diagnosed together.

In addition, the in present disclosure, a failure of the switch unit included in each battery pack is diagnosed by statistically analyzing the measured value of the pack current flowing through each battery pack without measuring the magnitude of the total current flowing through the multi battery pack. This diagnostic method provides an economic advantage since it is not needed to use the components required to monitor the total current of the multi battery pack.

In addition, according to the present disclosure, a failure of the switch unit included in each battery pack is diagnosed during the precharging stage before the multi battery pack starts being discharged, and if it is impossible to discharge some battery packs due to the failure of the switch unit so that the output cannot be sufficiently provided to the load, the discharging of the multi battery pack may be fundamentally blocked.

If such a control logic is applied to an electric vehicle or the like, when the discharging output of the multi battery pack is not so sufficient to ensure the safe operation of the vehicle, it is possible to prevent the vehicle from starting, thereby preventing accidents in advance.

In the description of the various exemplary embodiments of the present disclosure, it should be understood that the element referred to as 'unit' is distinguished functionally rather than physically. Therefore, each element may be selectively integrated with other elements or each element may be divided into sub-elements for effective implementation control logic(s). However, it is obvious to those skilled in the art that, if functional identity can be acknowledged for the integrated or divided elements, the integrated or divided elements fall within the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. An apparatus for diagnosing a failure of a switch unit included in a multi battery pack in which first to $n^{th}$ battery packs are connected in parallel through a parallel link node, the apparatus comprising:
    first to $n^{th}$ switch units respectively included in the first to $n^{th}$ battery packs, each switch unit connected to a corresponding one of the battery packs;
    first to $n^{th}$ current sensors respectively installed on power lines, each current sensor connected to a corresponding one of the first to $n^{th}$ battery packs to measure a current flowing through the corresponding battery pack;
    first to $n^{th}$ voltage sensors respectively installed at the first to $n^{th}$ battery packs, each voltage sensor configured to measure a voltage for a corresponding one of the first to $n^{th}$ battery packs; and
    a control unit operably coupled with the first to $n^{th}$ switch units, the first to $n^{th}$ current sensors and the first to $n^{th}$ voltage sensors,
    wherein the control unit is configured to:
    for each battery pack of the first to $n^{th}$ battery packs, measure a respective pack current flowing through the battery pack using the corresponding current sensor of the first to $n^{th}$ current sensors at a time point a preset amount of time after the corresponding switch unit of the first to $n^{th}$ switch units turns on;
    calculate an average pack current of the measured pack currents measured for the first to $n^{th}$ battery packs; and
    for each switch unit of the first to $n^{th}$ switch units:
        determine occurrence of an open failure at the switch unit based on the pack current of the corresponding battery pack having a magnitude smaller than the average pack current by a first threshold value or more; and
        output information about the corresponding battery pack including the switch unit at which the open failure occurs.

2. The apparatus according to claim 1,
    wherein the control unit is configured to:
    periodically measure voltage and current of each battery pack using the first to $n^{th}$ voltage sensors and the first to $n^{th}$ current sensors while the multi battery pack is being charged or discharged;
determine internal resistances of the first to $n^{th}$ battery packs from the periodically measured voltage data and current data for each battery pack;
calculate an average internal resistance of the first to $n^{th}$ battery packs,
determine occurrence of the open failure at the switch unit included in the corresponding battery pack based further on an internal resistance of the corresponding battery pack being different from the average internal resistance by less than a second threshold value.

3. The apparatus according to claim 2,
wherein the control unit is configured to determine occurrence of the open failure at the switch unit included in the corresponding battery pack based further on the internal resistance of the corresponding battery pack being different from the average internal resistance by less than 2.0 $\sigma_R$, wherein $\sigma_R$ is a standard deviation of the internal resistances of the first to $n^{th}$ battery packs, and the pack current of the corresponding battery pack having a magnitude smaller than the average pack current by at least 1.0 $\sigma_{current}$, wherein $\sigma_{current}$ is a standard deviation of the pack currents of the first to $n^{th}$ battery packs.

4. The apparatus according to claim 1,
wherein the control unit is configured to determine occurrence of the open failure at the switch unit included in the corresponding battery pack based further on the pack current of the corresponding battery pack having a magnitude smaller than the average pack current by at least 1.0 $\sigma_{current}$, wherein $\sigma_{current}$ is a standard deviation of the pack currents of the first to $n^{th}$ battery packs.

5. The apparatus according to claim 1,
wherein the control unit is configured to output the information about the corresponding battery pack through a display unit, a notification unit or a communication unit.

6. A battery management system, comprising the apparatus according to claim 1.

7. An electric driving mechanism, comprising the apparatus according to claim 1.

8. A method for diagnosing a failure of a switch unit included in a multi battery pack in which first to $n^{th}$ battery packs are connected in parallel through a parallel link node, first to $n^{th}$ switch units are respectively included in the first to $n^{th}$ battery packs with each switch unit connected to a corresponding one of the battery packs, first to $n^{th}$ current sensors are respectively installed on power lines with each current sensor connected to a corresponding one of the first to $n^{th}$ battery packs to measure a current flowing through the corresponding battery pack, and first to $n^{th}$ voltage sensors are respectively installed at the first to $n^{th}$ battery packs with each voltage sensor configured to measure a voltage for a corresponding one of the first to $n^{th}$ battery packs, the method comprising:
for each battery pack of the first to $n^{th}$ battery packs, measuring, by a control unit, a respective pack current flowing through the battery pack using the corresponding current sensor of first to $n^{th}$ current sensors at a time point a preset amount of time after the corresponding switch unit of first to $n^{th}$ switch units turns on,
calculating, by the control unit, an average pack current of the measured pack currents measured for the first to $n^{th}$ battery packs; and
for each switch unit of the first to $n^{th}$ switch units:
determining, by the control unit, that occurrence of open failure at the switch unit based on the pack current of the corresponding battery pack having a magnitude smaller than the average pack current by a first threshold value or more; and
outputting, by the control unit, information about the corresponding battery pack including the switch unit at which the open failure occurs.

9. The method according to claim 8, further comprising:
periodically measuring, by the control unit, voltage and current of each battery pack using the first to $n^{th}$ voltage sensors and the first to $n^{th}$ current sensors while the multi battery pack is being charged or discharged,
determining, by the control unit, internal resistances of the first to $n^{th}$ battery packs from the periodically measured voltage data and current data for each battery pack;
calculating, by the control unit, an average value of the internal resistances; and
determining, by the control unit, occurrence of an open failure at the switch unit included in the corresponding battery pack based further on an internal resistance of the corresponding battery pack being different from the average internal resistance by less than a second threshold value.

10. The method according to claim 9, comprising:
determining, by the control unit, occurrence of the open failure at the switch unit included in the corresponding battery pack based further on the internal resistance of the corresponding battery pack being different from the average internal resistance by less than 2.0 $\sigma_R$, wherein $\sigma_R$ is a standard deviation of the internal resistances of the first to $n^{th}$ battery packs, and the pack current of the corresponding battery pack having a magnitude smaller than the average pack current by at least 1.0 $\sigma_{current}$, wherein $\sigma_{current}$ is a standard deviation of the pack currents of the first to $n^{th}$ battery packs.

11. The method according to claim 8, comprising:
determining, by the control unit, occurrence of the open failure at the switch unit included in the corresponding battery pack based further on the pack current of the corresponding battery pack having a magnitude smaller than the average pack current by at least 1.0 $\sigma_{current}$, wherein $\sigma_{current}$ is a standard deviation of the pack currents of the first to $n^{th}$ battery packs.

12. The method according to claim 8, comprising:
outputting, by the control unit, the information about the corresponding battery pack through a display unit, a notification unit or a communication unit.

* * * * *